(12) United States Patent
Dening (10) Patent No.: US 7,053,713 B1
(45) Date of Patent: May 30, 2006

(54) MULTI-PHASE SWITCHING POWER SUPPLY HAVING BOTH VOLTAGE AND CURRENT FEEDBACK LOOPS

(75) Inventor: David Dening, Stokesdale, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 52 days.

(21) Appl. No.: 10/858,807

(22) Filed: Jun. 2, 2004

(51) Int. Cl.
*H03F 3/04* (2006.01)

(52) U.S. Cl. .................. 330/276; 330/285; 323/272

(58) Field of Classification Search ............ 363/16–19, 363/97, 98, 132, 72, 131; 323/272, 268, 323/282–288

See application file for complete search history.

(56) References Cited

U.S. PATENT DOCUMENTS

| | | | |
|---|---|---|---|
| 5,126,688 A | 6/1992 | Nakanishi et al. | 330/285 |
| 5,182,527 A | 1/1993 | Nakanishi et al. | 330/285 |
| 5,608,353 A | 3/1997 | Pratt | 330/295 |
| 5,629,648 A | 5/1997 | Pratt | 330/289 |
| 5,808,453 A | 9/1998 | Lee et al. | 323/224 |
| 5,870,296 A | 2/1999 | Schaffer | 363/65 |
| 6,137,274 A | 10/2000 | Rajagopalan | 323/272 |
| 6,198,347 B1 | 3/2001 | Sander et al. | 330/251 |
| 6,313,705 B1 | 11/2001 | Dening et al. | 330/276 |
| 6,414,469 B1 | 7/2002 | Zhou et al. | 323/272 |
| 6,459,602 B1 * | 10/2002 | Lipcsei | 363/132 |
| RE38,140 E | 6/2003 | Schaffer | 363/65 |
| 6,624,702 B1 | 9/2003 | Dening | 330/297 |
| 6,701,134 B1 | 3/2004 | Epperson | 455/102 |
| 6,701,138 B1 | 3/2004 | Epperson et al. | 455/127 |
| 6,724,252 B1 | 4/2004 | Ngo et al. | 330/133 |
| 6,734,724 B1 | 5/2004 | Schell et al. | 330/10 |
| 6,844,776 B1 | 1/2005 | Schell et al. | 330/10 |
| 2003/0054778 A1 | 3/2003 | Hecht | 455/115 |
| 2004/0183511 A1 | 9/2004 | Dening | 323/282 |

OTHER PUBLICATIONS

P. Asbeck, G. Hanington, P.F. Chen, and L. Larson, "Efficiency and Linearity Improvement in Power Amplifiers for Wireless Communications," University of California, San Diego, La Jolla, CA, IEEE 1998, pp. 15-18.

* cited by examiner

*Primary Examiner*—Rajnikant B. Patel
(74) *Attorney, Agent, or Firm*—Withrow & Terranova, PLLC (57) ABSTRACT

A switching multi-phase DC-DC converter is provided that includes a current feedback loop for each phase of the multi-phase converter and a voltage feedback loop providing a set-point to each of the current feedback loops. The combination of the current feedback loops and the voltage feedback loop operates to balance the currents in each of the phases of the multi-phase DC-DC converter such that the currents have substantially the same magnitude.

26 Claims, 8 Drawing Sheets

MULTI-PHASE SWITCHING POWER SUPPLY HAVING BOTH VOLTAGE AND CURRENT FEEDBACK LOOPS

CROSS-REFERENCE TO RELATED APPLICATIONS

This U.S. patent application is related to the concurrently filed U.S. patent application entitled MULTI-PHASE SWITHCING POWER SUPPLY FOR MOBILE TELEPHONE APPLICATIONS by David Dening, which is hereby incorporated by reference in its entirety.

FIELD OF THE INVENTION

The present invention relates to a switching power supply and specifically to a switching power supply having both voltage and current feedback loops.

BACKGROUND OF THE INVENTION

Mobile terminals such as cellular phones have become ubiquitous in modern society. Mobile terminals rely on sending an electromagnetic signal through the air to a base station and receiving electromagnetic signals through the air from the base station. An unfortunate side effect of the convenience of this wireless communication is that the signal-carrying electromagnetic radiation that forms the backbone of the communication may interfere with other electronic devices. This phenomenon is known as electromagnetic interference (EMI) or electromagnetic compatibility (EMC).

While interfering with other electronic devices like a computer or television is problematic, it is also possible for multiple mobile terminals operating in proximity to one another to have cross channel EMI. That is, one mobile terminal may be transmitting in a first channel, but some of the signal may spill over as noise into channels that are nearby in the frequency spectrum and on which a second mobile terminal is trying to operate. This spill over transmission is known by various terms, but is termed herein as "side band transmission."

To combat EMI in the United States, the FCC has promulgated standards for emissions that limit how much radiation may be radiated within certain frequency bands. On top of the FCC emissions rules, the various communication protocols used by mobile terminals may impose more restrictive limitations with specific attention paid to side band transmission levels. For example, Annex A of the GSM 05.05 version 8.5.1, released 1999, indicates that the maximum allowed signal for spurious side band signals is the larger of −60 dBc or −36 dBm. This measurement is to be averaged over at least two hundred transmit power cycles.

Against the backdrop of these standards, many mobile terminals incorporate DC-DC converters in their internal circuitry to change a DC voltage level of a battery to a lower or higher DC voltage level depending on the needs of the internal circuitry of the mobile terminal. A common method to implement a DC-DC converter uses a switching power supply that has a switch that opens and closes at a predetermined frequency according to a clock signal. Such switching power supplies exhibit a periodic ripple in their output at the switching frequency. If the DC-DC converter is used to provide a supply voltage (Vcc) to a saturated power amplifier, this ripple may mix with the radio frequency carrier to generate spurious side band signals.

To combat this ripple, manufacturers tend to use low drop-out linear regulators for power control associated with power amplifiers instead of the switching DC-DC converters. This substitution avoids the ripple issues, but does so at the expense of decreased efficiency and shorter battery life. Thus, there exists a need for a switching DC-DC converter having reduced output voltage ripple in order to reduce ripple spurs in a power amplifier's output while using an efficient switching power supply to provide a supply voltage for the power amplifier.

As discussed herein, the present invention provides a multi-phase switching power supply having reduced voltage ripple for mobile terminal applications. Multi-phase and interleaved power supplies include multiple parallel branches each providing a portion of a total current used to generate the output voltage. However, although the total current and the output voltage are well controlled, the currents in each of the multiple parallel branches are not well controlled. Accordingly, the total current may not be equally divided among the multiple parallel braches. Thus, there also remains a need for a switching power supply that controls the current in each branch of the power supply as well as controlling the output voltage.

SUMMARY OF THE INVENTION

The present invention provides a switching multi-phase DC-DC converter including a current feedback loop for each phase of the multi-phase converter and a voltage feedback loop providing a set-point to each of the current feedback loops. The combination of the current feedback loops and the voltage feedback loop operates to balance the currents in each of the phases of the multi-phase DC-DC converter such that the currents have substantially the same magnitude.

In general, the multi-phase DC-DC converter includes a multi-phase power train and a multi-phase converter control system. Each phase of the multi-phase power train includes an inductor, switching circuitry, and current sensing circuitry. The switching circuitry operates to couple the inductor to either a source voltage or to a current return path, such as ground, based on one of a plurality of control signals from the converter control system. The current sensing circuitry senses the current in the inductor and provides a current feedback signal to the converter control system. The converter control system includes a separate current feedback loop for each phase of the multi-phase power train. Each of the current feedback loops provides the control signal to the switching circuitry in one of the phases of the multi-phase power train based on the corresponding current feedback signal and a current loop set-point voltage. A voltage feedback loop provides the current loop set-point to each of the current feedback loops based on a set-point voltage and a voltage feedback signal indicative of the output voltage of the multi-phase DC-DC converter.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
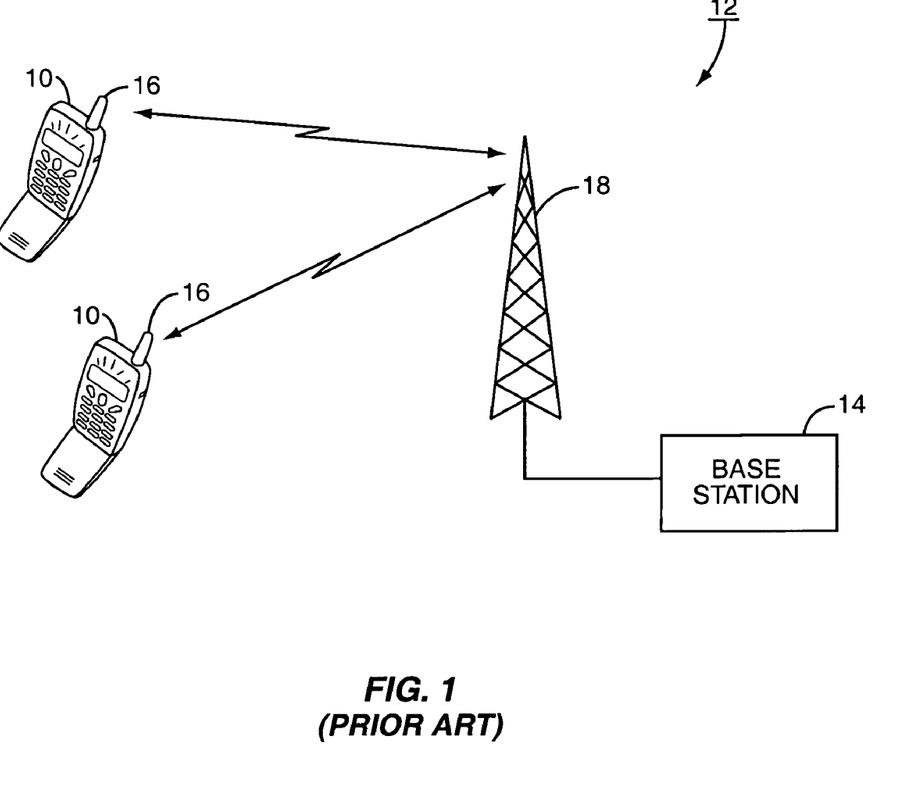
FIG. 1 illustrates a conventional exemplary communication system that may incorporate the present invention.

While the present invention could be used in a myriad of devices that use a switching power supply, one embodiment of the present invention is optimized to be used in a mobile terminal that operates according to the GSM and EDGE protocols. In GSM, an output power of the mobile terminal may be controlled by controlling a supply voltage supplied to a power amplifier in the transmit chain. For EDGE, the present invention may be used to perform amplitude modulation of a transmit signal by controlling a supply voltage supplied to a power amplifier in the transmit chain. For the purposes of illustrating the present invention, the following discussion will assume that a mobile terminal, such as mobile terminals 10 in FIG. 1 operate in a GSM or other cellular communication environment 12. Thus, mobile terminals 10 communicate with base stations 14 through mobile terminal antennas 16 and base station antennas 18 as is well understood.

Figure 2:
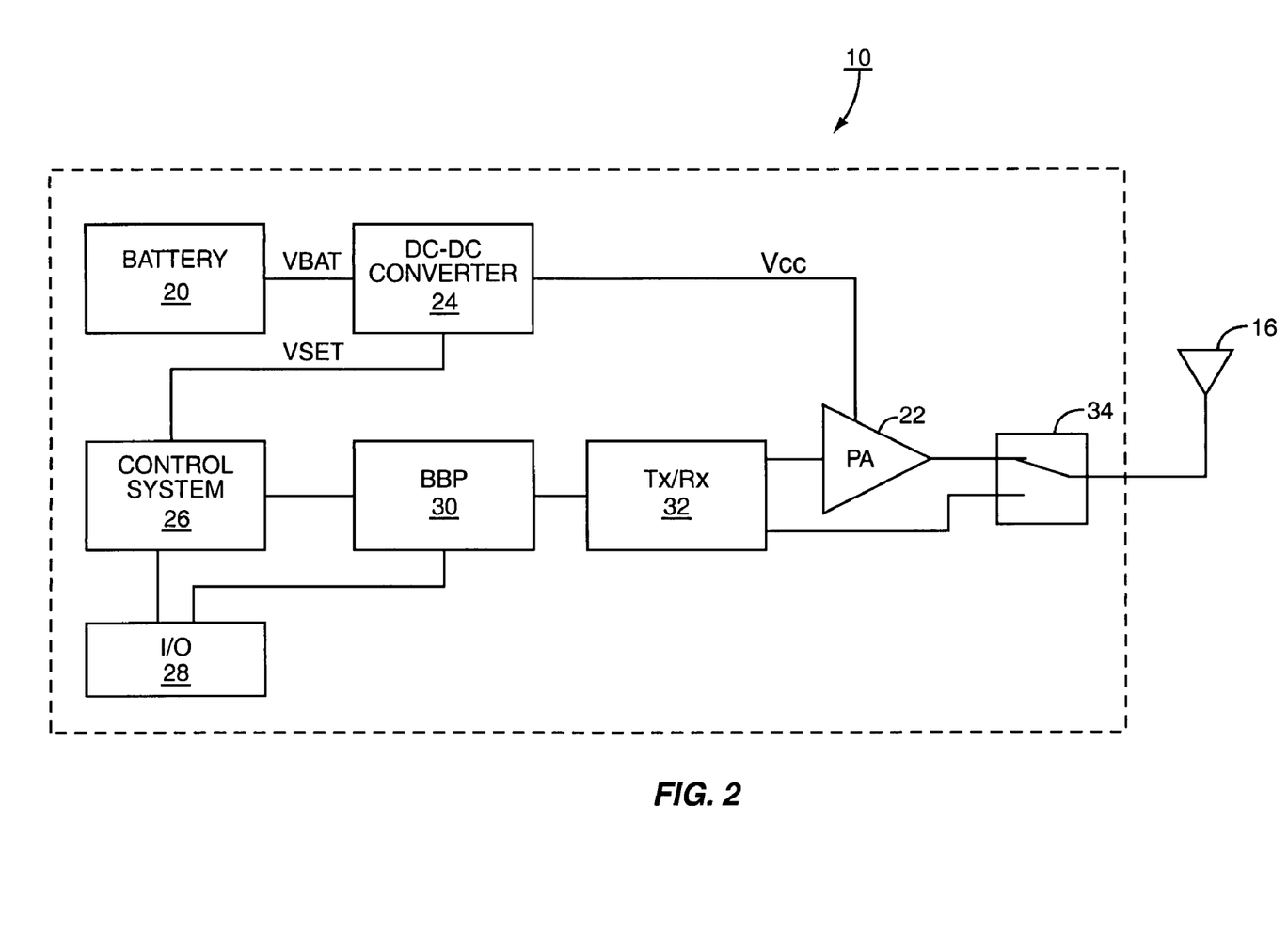
FIG. 2 illustrates a block diagram of a portion of the electronics within an exemplary mobile terminal.

A more detailed view of an exemplary mobile terminal 10 is presented in FIG. 2. The mobile terminal 10 comprises a battery 20 which powers the components of the mobile terminal 10 and in particular powers a power amplifier (PA) 22. Because the power amplifier 22 may not operate at the voltage level of the battery 20, a DC-DC converter 24 may be positioned between the battery 20 and the power amplifier 22 to convert the output of the battery (VBAT) to a suitable voltage (Vcc) for the power amplifier 22 based on a set-point voltage (VSET) from a controller such as a control system 26.

The power amplifier 22 is part of a transmitter chain within the mobile terminal 10. Specifically, the mobile terminal 10 may include the conventional control system 26 that controls an input/output (I/O) interface 28 that accepts user supplied inputs such as a voice signal and converts them to an electric signal for processing. The control system 26 passes the signal representative of the voice of the user to a baseband processor (BBP) 30 which performs preliminary processing steps on the signal to condition the signal for transmission. Alternatively, the BBP 30 may receive the signals directly from the input/output interface 28, as is well understood. The signal is then passed to a transceiver (Tx/Rx) 32 where the signal is converted to a radio frequency signal by mixing the signal with a carrier signal as is well understood. The radio frequency signal is then passed to the power amplifier 22 to boost the signal strength to a level appropriate for transmission. The boosted signal passes through a switch 34 and to the antenna 16 for transmission.

In the receive mode, the antenna 16 receives signals from the base station antenna 18 and passes the received signals through the switch 34 to the transceiver 32. The transceiver 32 converts the received signal from a radio frequency signal to a baseband signal before passing the baseband signal to the baseband processor 30 as is well understood.

As noted, if the DC-DC converter 24 is a switching power supply, a ripple is present in the supply voltage (Vcc) signal that passes from the DC-DC converter 24 to the power amplifier 22. This ripple shows up in the output of the power amplifier 22 as a spur in the frequency domain on either side of the carrier frequency. These spurs can appear in the neighboring channels causing unwanted interference.

Figure 3:
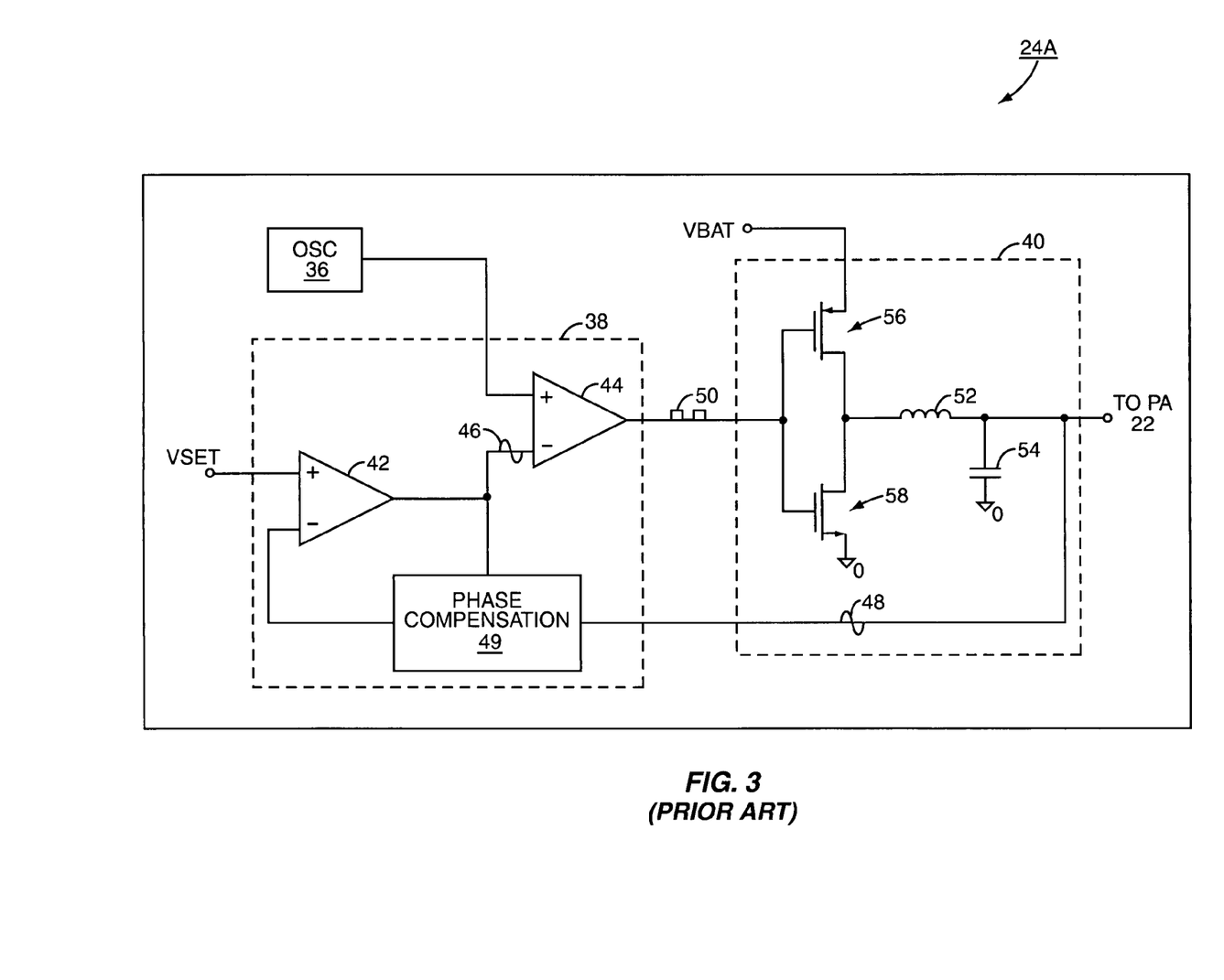
FIG. 3 illustrates a block diagram of a typical switching DC-DC converter.

A detailed schematic of a typical DC-DC converter 24A is illustrated in FIG. 3. In particular, the DC-DC converter 24A is, in the illustrated embodiment, a Buck converter. A Buck converter is also known as a step-down DC-DC converter. The Buck converter 24A includes an oscillator (OSC) 36, a converter control system 38, and a power train 40. The converter control system 38 in this example includes an error amplifier 42 and a modulator 44. The oscillator 36 outputs a saw-tooth voltage waveform derived from the voltage on an internal capacitor (not illustrated). In the example, the saw-tooth wave form ramps up and ramps down. Other oscillators 36 may provide a ramp up followed by a rapid return. Regardless of the particular waveform, the voltage is fed to the modulator 44 where it is compared to an error voltage signal 46 from the error amplifier 42.

The converter control system 38 operates according to a pulse width modulation scheme as is well understood. Specifically, the error amplifier 42 of the converter control system 38 compares a feedback signal 48 to the set-point reference (VSET) and generates the error voltage signal 46. The feedback signal 48 may be conditioned by compensation circuitry 49 for stability purposes. The error voltage signal 46 provides the threshold level used by the modulator 44 in processing the signal from the oscillator 36 to generate a signal 50. When the signal from the oscillator 36 is above the threshold determined by the error voltage signal 46, the signal 50 provided to the power train 40 is high. Conversely, when the signal from the oscillator 36 is below the error voltage signal 46 threshold, the power train 40 receives a low signal. In general, the signal 50 driving the power train 40 is a square wave with a duty cycle determined by the level of the error voltage signal 46.

The power train 40 includes an inductor 52, a capacitor 54, plus two switches 56, 58. The switches 56, 58 are, in the illustrated embodiment, a p-channel FET and an N-channel FET respectively as is well understood for a typical buck topology. The square wave signal 50 turns the switches 56, 58 on and off. When the signal 50 is low, switch 56 is ON and switch 58 is OFF. This presents a voltage close to the voltage from the battery 20 to the inductor 52 causing an increase in current and storing energy in the inductor 52's magnetic field. Current is supplied to the power amplifier 22 and to the capacitor 54. When the signal 50 is high, switch 56 is OFF and switch 58 is ON. This connects the input of the inductor 52 to ground. As a result, the inductor 52 provides decreasing current to the power amplifier 22, while drawing energy from its magnetic field. As the output voltage drops, the capacitor 54 discharges and provides some of the load current.

Figure 4:
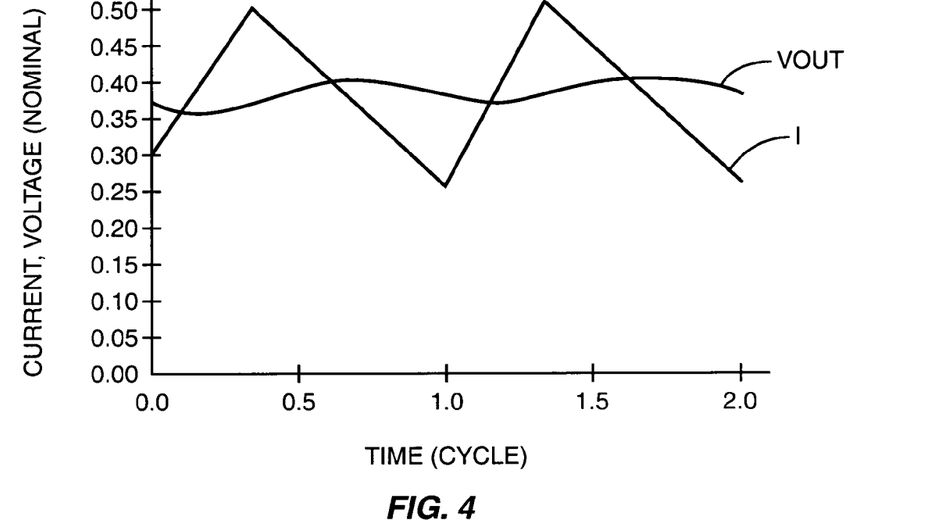
FIG. 4 is a graphical representation of the voltage ripple in the output voltage of the typical switching DC-DC converter of FIG. 3.

A ripple in the output voltage occurs due to a current ripple in the inductor 52 as is well understood. In essence, the ripple in the output voltage can be visualized as an AC component riding on top of a DC voltage. The ripple in the output voltage for one embodiment of the buck converter 24A is illustrated in FIG. 4. In this embodiment, the output voltage is 0.375 of full scale. As shown, the output voltage (VOUT) varies between 0.4 and 0.35 of full scale, thereby defining a ripple voltage having a magnitude of 0.05 of full scale. The ripple voltage occurs due to a ripple current (I) through the inductor 52 as is well understood. Further, the magnitude of the ripple voltage is a directly related to the magnitude of the ripple current (I), which is defined by the following equation:

$$\Delta I \cong \frac{VBAT - VOUT}{2L} DT_S,$$

where $\Delta I$ is the magnitude of the ripple current (I), L is the inductance of the inductor 52, D is the duty cycle of the signal 50, and $T_S$ is equal to $1/f_S$ where $f_S$ is the switching frequency. In this embodiment, the switching frequency $f_S$ is the frequency of the clock signal output from the oscillator 36.

Figure 5:
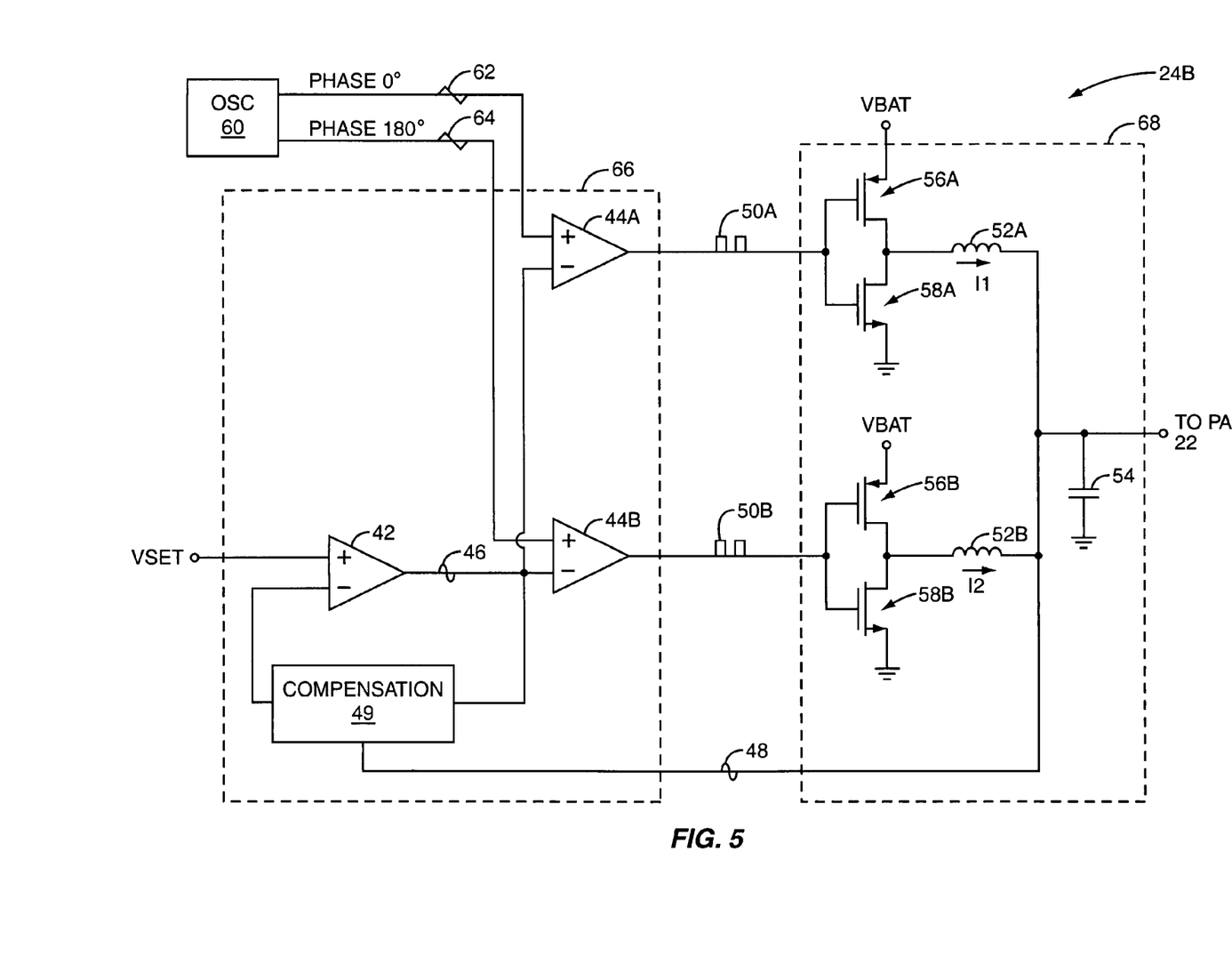
FIG. 5 is a detailed illustration of a multi-phase DC-DC converter according to one embodiment of the present invention.

A detailed schematic of a DC-DC converter 24 according to one embodiment of the present invention is illustrated in FIG. 5. In particular, the DC-DC converter 24 is, in the illustrated embodiment, a multi-phase Buck converter 24B according to one embodiment of the present invention. More specifically, the multi-phase Buck converter 24B is a dual-phase Buck converter. However, it should be noted that the multi-phase Buck converter 24B can have a greater number of phases in order to further reduce the voltage ripple in the output voltage.

The dual-phase Buck converter 24B includes a dual-phase oscillator (OSC) 60 providing a first clock signal 62 and a second clock signal 64 that is essentially 180° out of phase with the first clock signal 62. The dual-phase Buck converter 24B also includes a dual-phase converter control system 66 and a dual-phase power train 68. The converter control system 66 in this example includes the error amplifier 42 and modulators 44A and 44B. The oscillator 60 outputs the first and second clock signals 62 and 64 each having a saw-tooth voltage waveform derived from the voltage on an internal capacitor (not illustrated). In the example, the saw-tooth wave form ramps up and ramps down. Other oscillators 60 may provide a ramp up followed by a rapid return. Regardless of the particular waveform, first and second clock signals are fed to the modulators 44A and 44B, respectively, where they are compared to the error voltage signal 46 from the error amplifier 42.

In the embodiment illustrated, the dual-phase converter control system 66 operates according to a pulse width modulation scheme as is well understood. Specifically, the error amplifier 42 of the dual-phase converter control system 66 compares the feedback signal 48 to the set-point voltage (VSET) and generates the error voltage signal 46. The feedback signal 48 may be conditioned by compensation circuitry 49 for stability purposes. The error voltage signal 46 provides the threshold level used by the modulators 44A and 44B in processing the signals 62 and 64 from the oscillator 60 to generate first and second signals 50A and 50B. When the signal 62 from the oscillator 60 is above the threshold determined by the error voltage signal 46, the signal 50A provided to the dual-phase power train 68 from the modulator 44A is high. Conversely, when the signal 62 from the oscillator 60 is below the error voltage signal 46 threshold, the signal 50A provided to the dual-phase power train 68 is low. Similarly, when the signal 64 from the oscillator 60 is above the threshold determined by the error voltage signal 46, the signal 50B provided to the dual-phase power train 68 from the modulator 44B is high. When the signal 64 from the oscillator 60 is below the error voltage signal 46 threshold, the signal 50B provided to the dual-phase power train 68 is low. In general, the signals 50A and 50B driving the power train 40 are square wave signals that are essentially 180° out of phase and have a duty cycle determined by the level of the error voltage signal 46.

The dual-phase power train 68 includes inductors 52A and 52B, a capacitor 54, and transistor switches 56A, 56B, 58A, and 58B. The switches 56A, 58A are, in the illustrated embodiment, a p-channel FET and an N-channel FET respectively as is well understood for a typical buck topology. The square wave signal 50A turns the switches 56A, 58A on and off. When the signal 50A is low, switch 56A is ON and switch 58A is OFF. This presents a voltage close to the voltage (VBAT) from the battery 20 to the inductor 52A causing an increase in current I1 and storing energy in the inductor 52A's magnetic field. When the signal 50A is high, switch 56A is OFF and switch 58A is ON. This connects the input of the inductor 52A to ground. As a result, the current I1 provided by the inductor 52A decreases, while the inductor 52A draws energy from its magnetic field. Similarly, the switches 56B, 58B are, in the illustrated embodiment, a p-channel FET and an N-channel FET respectively. The square wave signal 50B turns the switches 56B, 58B on and off. When the signal 50B is low, switch 56B is ON and switch 58B is OFF. This presents a voltage close to the voltage (VBAT) from the battery 20 to the inductor 52B causing an increase in current I2 and storing energy in the inductor 52B's magnetic field. When the signal 50B is high, switch 56B is OFF and switch 58B is ON. This connects the input of the inductor 52B to ground. As a result, the current I2 provided by the inductor 52B decreases, while the inductor 52B draws energy from its magnetic field.

In combination, the transistor switches 56A and 58A and the transistor switches 56B and 58B provide the currents I1 and I2, respectively, such that the currents I1 and I2 are essentially 180° out of phase. Accordingly, the current ripple in the inductor 52A is essentially 180° out of phase with the current ripple in the inductor 52B. The currents I1 and I2 are summed at the capacitor 54, and as discussed below in more detail, tend to cancel, thereby resulting is a reduced current ripple and thus a reduced ripple in the output voltage of the Buck converter 24B as compared to the Buck converter 24A.

Figure 6:
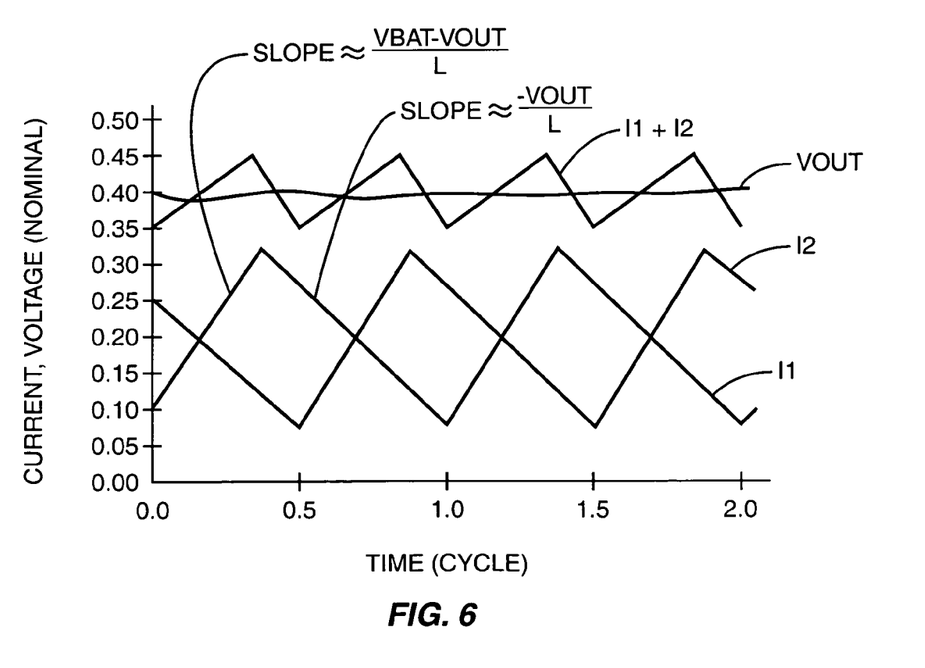
FIG. 6 is a graphical representation of the voltage ripple in the output voltage of the multi-phase DC-DC converter of FIG. 5.

FIG. 6 illustrates the performance of the dual-phase Buck converter 24B of FIG. 5. The average output voltage (VOUT) is the same as in FIG. 4 i.e. 0.375 of full scale. As discussed above, since the currents I1 and I2 are substantially 180° out of phase, they tend to cancel. However, due to inherent characteristics of the inductors 52A and 52B, the currents I1 and I2 increase and decrease at different rates unless the output voltage of the Buck converter 24B is half the voltage (VBAT). More specifically, the currents I1 and I2 increase at a rate of approximately (VBAT−VOUT)/L and decrease at a rate of approximately −VOUT/L, as illustrated. Thus, the sum of the currents I1 and I2 will be essentially zero only when the rate of increase (VBAT−VOUT)/L and the rate of decrease (−VOUT/L) are substantially the same for both of the currents I1 and I2. This occurs when the output voltage (VOUT) is approximately half the voltage (VBAT). For all other output voltages, summing of the currents I1 and I2 results in the total current (I1+I2) having a peak-to-peak magnitude that is substantially reduced as compared to the peak-to-peak magnitude of either of the currents I1 and I2. Accordingly, the voltage ripple in the output voltage of the dual-phase Buck converter 24B is substantially reduced for all output voltages as compared to the voltage ripple in the output voltage of the Buck converter 24A of FIG. 3. It should also be noted that the ripple in the total current (I1+I2) is at a frequency that is twice the frequency of the ripple in the currents I1 and I2. Accordingly, using the same size capacitor 54 in the dual-phase Buck converter 24B as in the Buck converter 24A provides an additional reduction in the output voltage ripple.

Figure 7:
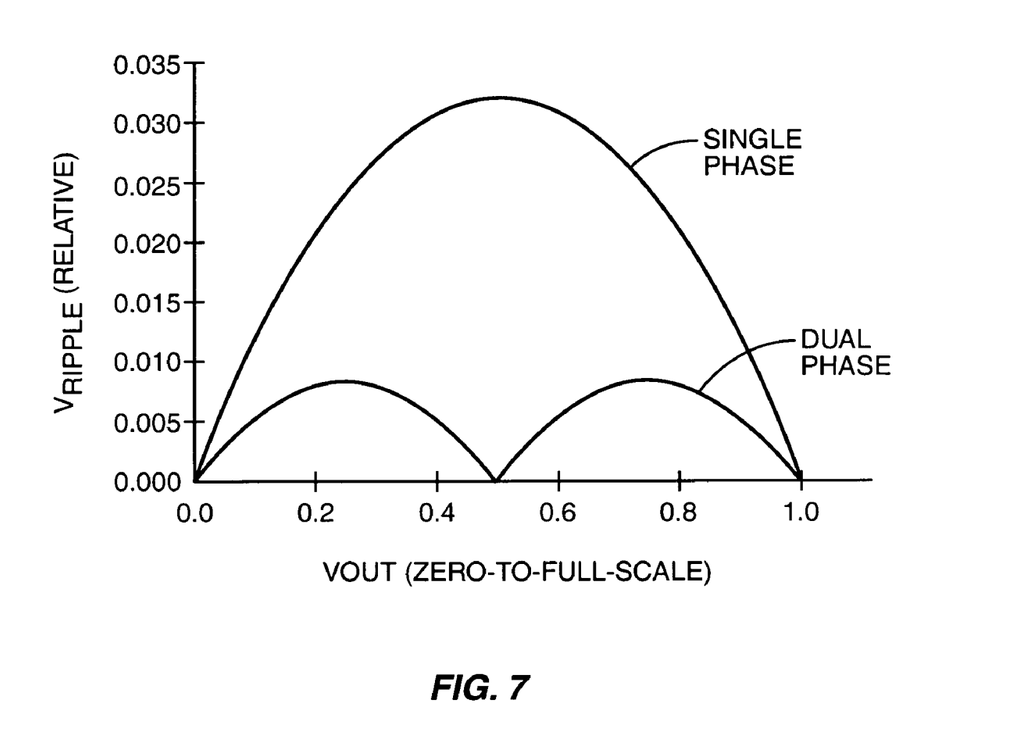
FIG. 7 is a graphical comparison of the magnitude of the voltage ripple in the output of DC-DC converter FIG. 3 and the multi-phase DC-DC converter of FIG. 5.

FIG. 7 illustrates the output ripple performance of the dual-phase Buck converter 24B as compared to the output ripple performance of the single-phase Buck converter 24A over the complete range of output voltages. The magnitude of the voltage ripple is directly related to the magnitude of the current ripple in the inductor 52 for the converter 24A or the total current ripple resulting from the sum of the currents I1 and I2 through the inductors 52A and 52B for the converter 24B. For the single-phase Buck converter 24A, the magnitude of the current ripple is defined as:

$$\Delta I \cong \frac{VBAT - VOUT}{L} DT_S,$$

where $VOUT \cong VBAT \times D$, thus $$\Delta I \cong \frac{VBAT(1-D)}{L} DT_S,$$

where $\Delta I$ is the magnitude of the ripple current (I), L is the inductance of the inductor 52, D is the duty cycle of the signal 50, and $T_S$ is equal to $1/f_S$ where $f_S$ is the switching frequency. Since the duty cycle D increases from 0 to 1 as the output voltage (VOUT) goes from zero to full scale (VBAT), the magnitude of the current ripple and thus the voltage ripple ($V_{RIPPLE}$) goes from zero to its maximum as the output voltage is increased from zero to half scale and decreases from its maximum back to zero as the output voltage increases from half scale to full scale, as illustrated.

For a multi-phase Buck converter, the magnitude of the total current ripple through the capacitor 54 is given by the equation:

$$\Delta I \cong \frac{VBAT(1-D) \cdot D \cdot T_S}{L} \cdot \frac{N\left(D - \frac{m}{N}\right)\left(\frac{m+1}{N} - D\right)}{D(1-D)},$$

where $m = \text{floor}(N \cdot D)$, and where $\Delta I$ is the magnitude of the ripple current (I), L is the inductance of the inductors 52 in each phase of the converter, D is the duty cycle of each of the control signals 50, and $T_S$ is equal to $1/f_S$ where $f_S$ is the switching frequency. Thus, for the dual-phase Buck converter 24B, N=2 and m is zero when D is between 0 and 0.5, m is 1 when D is between 0.5 and 1. Accordingly, the magnitude of the current ripple for the dual-phase Buck converter 24B increases from zero to a maximum value as the duty cycle, and thus the output voltage, increases from zero to 0.25. The magnitude of the total current ripple then decreases from the maximum value back to zero as the duty cycle, and thus the output voltage, increases from 0.25 to 0.5. Similarly, the magnitude of the total current ripple again increases to the maximum value and back to zero as the duty cycle, and thus the output voltage, increases from 0.5 to 1.

It should be noted that at half the maximum output voltage (0.5 Full-Scale), the single-phase Buck converter 24A has a maximum output voltage ripple, but the dual-phase buck converter 24B has a null. The null occurs because the currents I1 and I2 in the inductors 52A and 52B are essentially 180° out of phase and have essentially identical shapes when the output voltage is at half the maximum output voltage. It should also be noted that the maximum magnitude of the voltage ripple for the dual-phase Buck converter 24B is less than half the maximum magnitude of the voltage ripple for the single-phase Buck converter 24A. It should also be noted that in a similar fashion, the magnitude of the total current ripple for an N-phase Buck converter has N-1 null points and has a maximum value that is increasingly smaller as N increases.

Referring back to FIG. 5, the sum of the currents I1 and I2 is well controlled by the converter control system 66. However, the switches 56A, 58A combined with the inductor 52A form a first low impedance source, and the switches 56B, 58B combined with the inductor 52B form a second low impedance source. When the two low impedance sources are combined at the capacitor 54, the individual currents I1 and I2 through the inductors 52A and 52B are indeterminate, as will be understood by one of ordinary skill in the art. In some implementations, it may be desirable to control both the output voltage and the currents I1 and I2.

Figure 8:
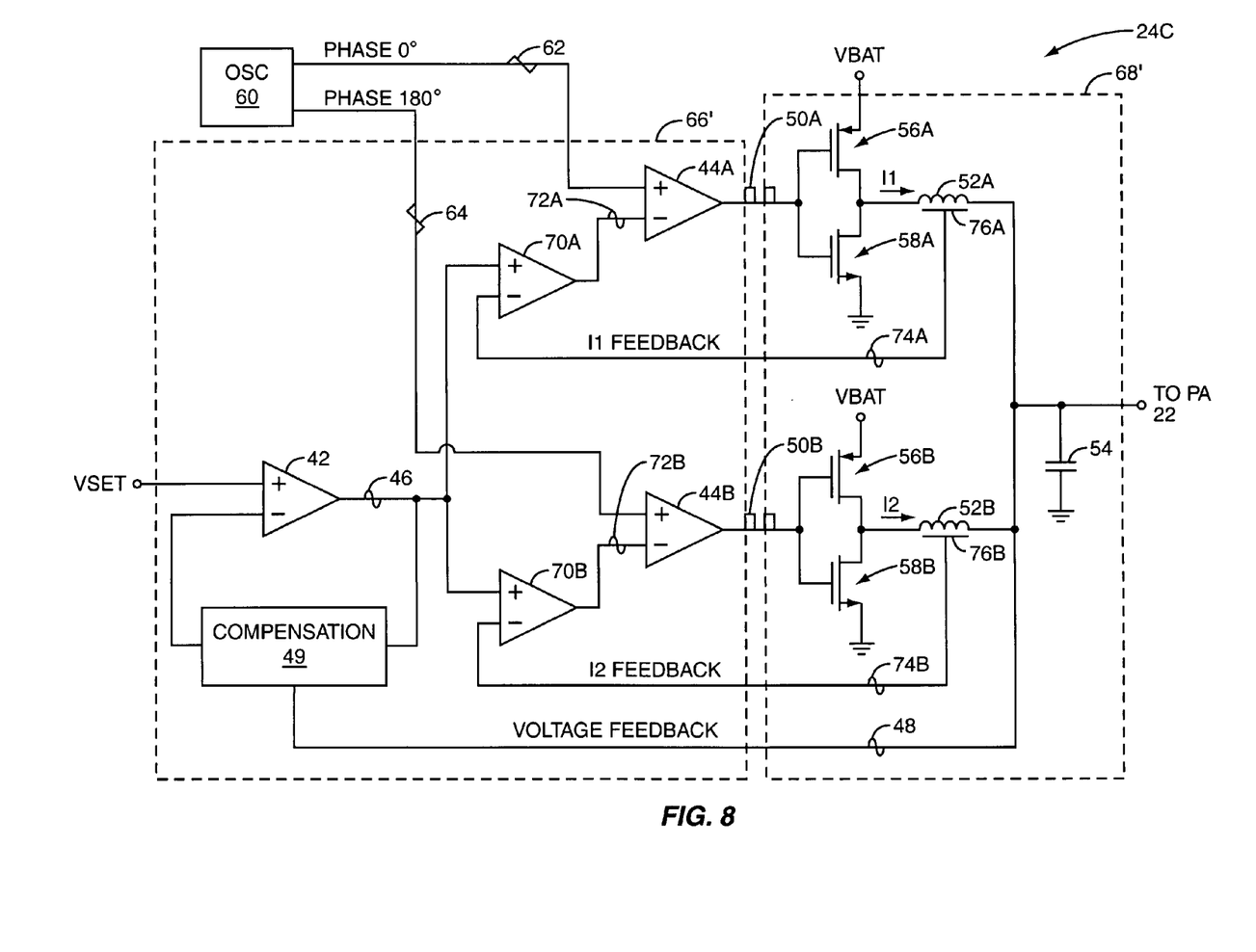
FIG. 8 is a detailed illustration of a DC-DC converter having both voltage and current feedback loops according to one embodiment of the present invention.

FIG. 8 is a detailed schematic of a DC-DC converter 24 according to another embodiment of the present invention. In particular, the DC-DC converter is, in the illustrated embodiment, a multi-phase buck converter 24C having both voltage and current feedback loops. More specifically, the multi-phase buck converter 24C is a dual-phase buck converter having both voltage and current feedback loops.

The dual-phase Buck converter 24C operates similarly to the dual-phase Buck converter 24B of FIG. 5. In general, the dual-phase Buck converter 24C includes the dual-phase oscillator (OSC) 60 providing a first clock signal 62 and a second clock signal 64 that is essentially 180° out of phase with the first clock signal 62. The dual-phase Buck converter 24C also includes a dual-phase converter control system 66' and a dual-phase power train 68'. The converter control system 66' includes the error amplifier 42, current error amplifiers 70A and 70B, and the modulators 44A and 44B. The oscillator 60 outputs the first and second clock signals 62 and 64 each having a saw-tooth voltage waveform derived from the voltage on an internal capacitor (not illustrated). In the example, the saw-tooth wave form ramps up and ramps down. Other oscillators 60 may provide a ramp up followed by a rapid return. Regardless of the particular waveform, first and second clock signals are fed to the modulators 44A and 44B, respectively, where they are compared to current error signals 72A and 72B, respectively, from the current error amplifiers 70A and 70B.

According to one embodiment of the present invention, the dual-phase Buck converter 24C includes both an outer voltage feedback loop and two inner current feedback loops. In this embodiment, the outer feedback loop includes the voltage error amplifier 42 that operates based on the voltage feedback signal 48 to provide the error signal 46 which operates as a set-point for the inner current feedback loops. The inner current feedback loops include the current error amplifiers 70A and 70B and the modulators 44A and 44B. It should be noted that each of the current feedback loops operates independently from the other current feedback loops. Thus, as described below in more detail, the control signal 50A is provided based on the current I1 through the inductor 52A independently from the current I2 through the inductor 52B. It should also be noted that, in one embodiment, the current feedback loops have essentially the same set-point voltage versus current characteristic such that the currents I1 and I2 have essentially the same magnitude.

In the embodiment illustrated, the dual-phase converter control system 66' operates according to a pulse width modulation scheme as is well understood. Specifically, the error amplifier 42 of the dual-phase converter control system 66' compares the voltage feedback signal 48 to the set-point voltage (VSET) and generates the error voltage signal 46. The voltage feedback signal 48 may be conditioned by the compensation circuitry 49 for stability purposes. The error voltage signal 46 is provided to the current error amplifiers 70A and 70B. The current error amplifiers 70A and 70B compare the error signal 46 to current feedback signals 74A and 74B, respectively, and provide current error signals 72A and 72B. The error signal 72A is provided to the modulator 44A as the threshold level used by the modulator 44A in processing the signal 62 from the oscillator 60 to generate the first signal 50A. The error signal 72B is provided to the modulator 44B as the threshold level used by the modulator 44B in processing the signal 64 from the oscillator 60 to generate the second signal 50B.

When the signal 62 from the oscillator 60 is above the threshold determined by the error signal 72A, the signal 50A provided to the dual-phase power train 68' from the modulator 44A is high. Conversely, when the signal 62 from the oscillator 60 is below the error signal 72A threshold, the signal 50A provided to the dual-phase power train 68' is low. Similarly, when the signal 64 from the oscillator 60 is above the threshold determined by the error signal 72B, the signal 50B provided to the dual-phase power train 68' from the modulator 44B is high. When the signal 64 from the oscillator 60 is below the error signal 72B threshold, the signal 50B provided to the dual-phase power train 68' is low. In general, the signals 50A and 50B driving the dual-phase power train 68' are square wave signals that are essentially 180° out of phase and have a duty cycle determined by the level of the error signals 46, 72A, and 72B.

The dual-phase power train 68' includes the inductors 52A and 52B, the capacitor 54, and the transistor switches 56A, 56B, 58A, and 58B. As discussed above, the square wave signal 50A controls the switches 56A, 58A, and the square wave signal 50B controls the switches 56A, 58B. In addition, the dual-phase power train 68' includes current sensing means 76A and 76B. The current sensing means 76A senses the current in the inductor 52A and provides the current feedback signal 74A to the current error amplifier 70A. The current sensing means 76B senses the current in the inductor 52B and provides the current feedback signal 74B to the current error amplifier 70B. It should be noted that the current sensing means 76A and 76B can be any one of a number of current sensing circuitries and methodologies commonly known.

In operation, the error amplifier 42 compares the output voltage to the set-point voltage (VSET) and supplies the error signal 46 as a set-point to the current error amplifiers 70A and 70B. The error amplifiers 70A and 70B compare the current feedback signals 74A and 74B to the error signal 46 such that the currents I1 and I2 are adjusted to maintain the output voltage. Further, the currents I1 and I2 are controlled such that the currents I1 and I2 through the inductors 52A and 52B are equally matched to an accuracy defined by the accuracy of the current sensing means 76A and 76B and the voltage and current feedback loops.

This control scheme is easily adapted to any multi-phase or interleaved DC-DC converter. More specifically, the multi-phase DC-DC converter 24C may include any number of phases wherein the current in each inductor 52 is controlled by a separate current loop. The set-point for the current loops is provided by a single voltage control loop. The steady state current provided by each phase will be matched to an accuracy produced by the errors of the current sensing feedback loops.

Figure 9:
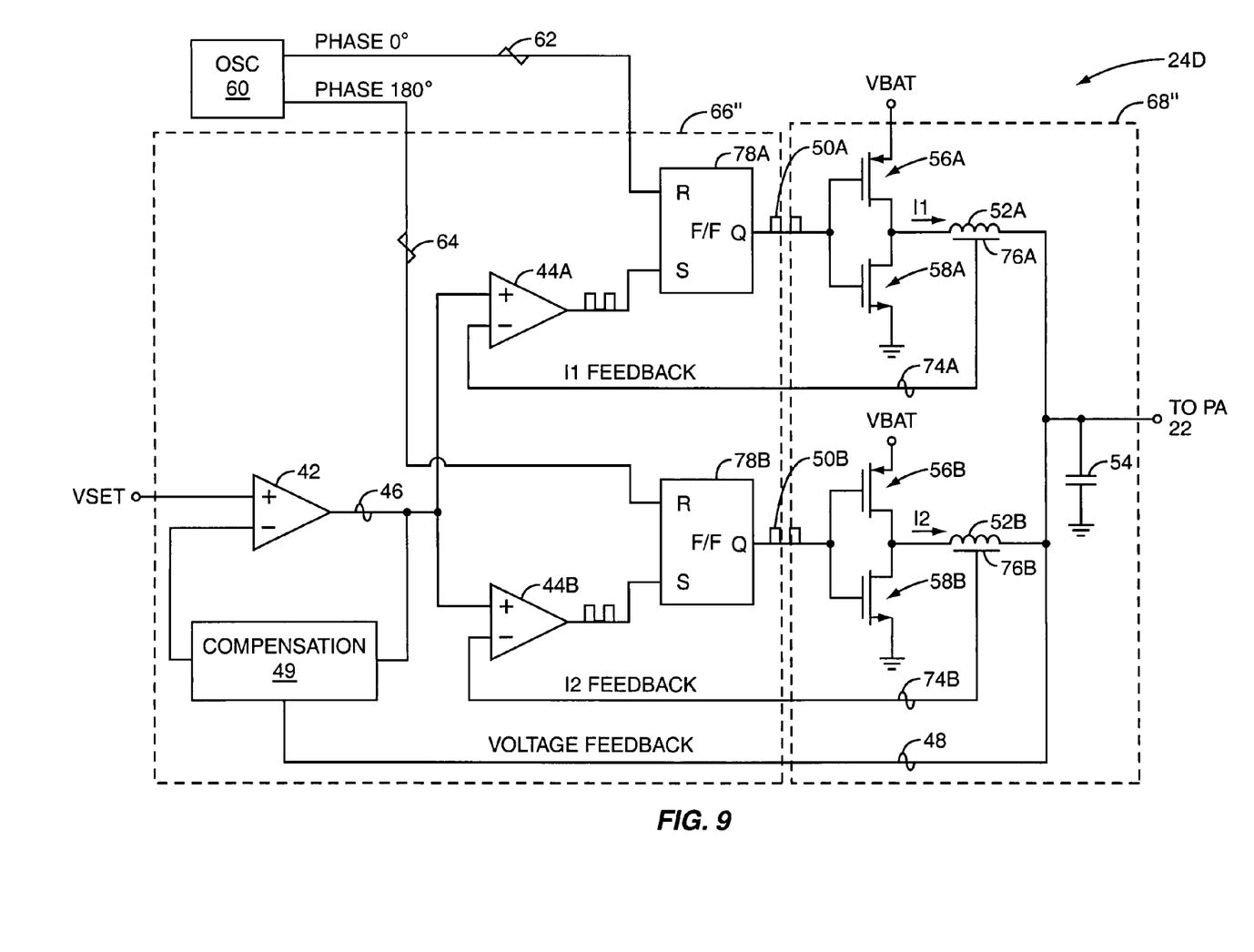
FIG. 9 is a detailed illustration of a DC-DC converter having both voltage and current feedback loops according to another embodiment of the present invention.

FIG. 9 is a detailed schematic of a DC-DC converter 24 according to another embodiment of the present invention. In particular, the DC-DC converter is, in the illustrated embodiment, a multi-phase buck converter 24D having a voltage feedback loop and instantaneous current feedback loops. More specifically, the multi-phase buck converter 24C is a dual-phase buck converter having a voltage feedback loop and instantaneous current feedback loops.

The Buck converter 24D operates similarly to the Buck converter 24C of FIG. 8. However, in the dual-phase Buck converter 24D the current sensing means 76A and 76B provide the current feedback signals 74A and 74B directly to the modulators 44A and 44B, respectively. Thus, the duty cycle of the outputs of the modulators 44A and 44B are instantaneously adjusted for changes in the currents I1 and I2. The outputs of the modulators 44A and 44B are provided to flip-flop circuits 78A and 78B. The operation of the flip-flop circuits 78A and 78B are well known. Based on the clock signals 62 and 64, the flip-flop circuits 78A and 78B adjust the phase of the outputs of the modulators 44A and 44B and provide the signals 50A and 50B that are essentially 180° out of phase.

According to this embodiment of the present invention, the dual-phase Buck converter 24D includes both an outer voltage feedback loop and two inner current feedback loops. In this embodiment, the outer feedback loop includes the voltage error amplifier 42 that operates based on the voltage feedback signal 48 to provide the error signal 46 which operates as a set-point for the inner current feedback loops. The inner current feedback loops include the modulators 44A and 44B and the flip-flop circuits 78A and 78B.

In operation, the error amplifier 42 compares the output voltage to the set-point voltage (VSET) and supplies the error signal 46 to the modulators 44A and 44B as a threshold voltage. The modulators 44A and 44B compare the error signal 46 to the current feedback signals 74A and 74B, and the flip-flop circuits 78A and 78B adjust the phase of the outputs of the modulators 44A and 44B to provide the signals 50A and 50B. The combined effect of the error amplifier 42, the modulators 44A and 44B, and the flip-flop circuits 78A and 78B is to provide the signals 50A and 50B that are essentially 180° out of phase and that have duty cycles that control the currents I1 and I2 such that they are equally matched and provide the desired output voltage.

The present invention provides substantial opportunity for variation without departing from the spirit and scope of the present invention. For example, although the Buck converter 24B of FIG. 5 is illustrated as a dual-phase Buck converter, it is to be understood that the Buck converter 24B may have any number of two or more phases. Further, by having additional phases, the magnitude of the voltage ripple of the output voltage of the Buck converter 24B is further reduced. Further, although FIG. 5 illustrates a particular embodiment of the converter control system 66, any number of control systems may be used to provide the signals 50A and 50B to the dual-phase power train 68 for controlling the output voltage. As another example, although the Buck converters 24C and 24D of FIGS. 8 and 9 are illustrated as dual-phase Buck converters, it is to be understood that the current feedback loop can be used in a Buck converter having any number of one or more phases. Further, the converter control systems 66' and 66" are merely exemplary. Other embodiments will be apparent to one of ordinary skill in the art.

Those skilled in the art will recognize improvements and modifications to the preferred embodiments of the present invention. All such improvements and modifications are considered within the scope of the concepts disclosed herein and the claims that follow.

What is claimed is:

1. A multi-phase DC-DC converter comprising:
   a plurality of inductors each having a first terminal coupled to an output capacitor;
   a plurality of switching circuitries each adapted to couple a second terminal of one of the plurality of inductors to either a source voltage or a current return path based on one of a plurality of control signals;
   a plurality of current sensing means each adapted to generate a current feedback signal indicative of a current through one of the plurality of inductors;
   a plurality of current feedback loops each adapted to generate one of the plurality of control signals based on the current feedback signal from one of the plurality of current sensing means and a current loop set-point voltage; and
   a voltage feedback loop adapted to generate the current loop set-point voltage based on a set-point voltage and a voltage feedback signal indicative of a supply voltage at an output of the multi-phase DC-DC converter;
   wherein each of the plurality of the current feedback loops operate independently from each other of the plurality of current feedback loops.

2. The multi-phase DC-DC converter of claim 1 wherein each of the plurality of current feedback loops has essentially the same current loop set-point voltage versus current characteristic such that the currents through the plurality of inductors have essentially the same magnitude.

3. The multi-phase DC-DC converter of claim 1 wherein the voltage feedback loop comprises voltage error amplification circuitry adapted to compare the voltage feedback signal and the set-point voltage and provide the current loop set-point voltage based on a difference between the voltage feedback signal and the set-point voltage.

4. The multi-phase DC-DC converter of claim 3 wherein the voltage feedback loop further comprises compensation circuitry adapted to receive the supply voltage and provide the voltage feedback signal to the voltage error amplification circuitry.

5. The multi-phase DC-DC converter of claim 1 wherein the each of the plurality of current feedback loops comprises:
   current error amplification circuitry adapted to compare the current feedback signal from one of the plurality of current sensing means and the current loop set-point voltage and provide a current error signal based on a difference between the current feedback signal from one of the plurality of current sensing means and the current loop set-point voltage; and
   modulation circuitry adapted to receive the current error signal and one of a plurality of clock signals and provide the one of the plurality of control signals based on a comparison of the one of the plurality of clock signals and the current error signal.

6. The multi-phase DC-DC converter of claim 5 further comprising an oscillator adapted to provide the plurality of clock signals such that each of the plurality of clock signals is out of phase with a first of the plurality of clock signals by multiples of 360°/N and N is the number of control signals in the plurality of control signals.

7. The multi-phase DC-DC converter of claim 1 wherein each of the plurality of current feedback loops comprises:
   modulation circuitry adapted to compare the current feedback signal from one of the plurality of current sensing means and the current loop set-point voltage and provide a modulated signal based on a comparison of the current feedback signal from one of the plurality of current sensing means and the current loop set-point voltage; and
   a flip-flop circuit adapted to generate the one of the plurality of control signals based on the modulated signal and one of a plurality of clock signals.

8. The multi-phase DC-DC converter of claim 7 further comprising an oscillator adapted to provide the plurality of clock signals such that each of the plurality of clock signals is out of phase with a first of the plurality of clock signals by multiples of 360°/N and N is the number of control signals in the plurality of control signals.

9. The multi-phase DC-DC converter of claim 1 wherein each of the plurality of current feedback loops are further adapted to generate the one of the plurality of control signals based on one of a plurality of clock signals.

10. The multi-phase DC-DC converter of claim 9 further comprising an oscillator adapted to provide the plurality of clock signals such that each of the plurality of clock signals is out of phase with a first of the plurality of clock signals by multiples of 360°/N and N is the number of control signals in the plurality of control signals.

11. The multi-phase DC-DC converter of claim 1 wherein the multi-phase DC-DC converter is part of a mobile terminal comprising:
   circuitry adapted to provide a transmit signal;
   a power amplifier adapted to amplify the transmit signal based on the supply voltage from the multi-phase DC-DC converter and provide an amplified transmit signal to an antenna for transmission.

12. A method of balancing currents in each phase of a multi-phase DC-DC converter comprising:
  a) generating a plurality of currents each based on a corresponding one of a plurality of control signals;
  b) providing the plurality of currents to a first terminal of an output capacitor, thereby charging the output capacitor such that a supply voltage is provided across the output capacitor; and
  c) providing the plurality of control signals based on a set-point voltage and the supply voltage, the step of providing the plurality of control signals comprising:
    i) generating a current loop set-point voltage based on comparing a voltage feedback signal indicative of the supply voltage and the set-point voltage and providing the current loop set-point voltage based on a difference between the voltage feedback signal and the set-point voltage;
    ii) sensing each of the plurality of currents;
    iii) generating a plurality of current feedback signals each indicative of one of the plurality of currents, wherein each of the plurality of current feedback signals is independent from each other of the plurality of current feedback signals; and
    iv) generating the plurality of control signals based on the current loop set-point voltage and the plurality of current feedback signals, wherein each of the plurality of control signals is generated based on a one of the plurality of current feedback signals and the current loop set-point voltage.

13. The method of claim 12 wherein the step of generating the plurality of control signals further comprises generating the plurality of control signals such that each of the plurality of control signals is out of phase with a first of the plurality of control signals by multiples of 360°/N, where N is a number of control signals in the plurality of control signals.

14. The method of claim 13 wherein the step of generating the plurality of currents further comprises generating the plurality of currents based on a duty cycle of each of the plurality of control signals.

15. The method of claim 14 wherein the step of generating the plurality of currents comprises:
  providing a plurality of inductors each having a first terminal coupled to the output capacitor; and
  coupling a second terminal of one of the plurality of inductors to either a source voltage or a current return path based on a corresponding one of the plurality of control signals.

16. The method of claim 13 wherein the step of generating the plurality of control signals is further based on a plurality of clock signals wherein each of the plurality of clock signals is out of phase with a first of the plurality of clock signals by multiples of 360°/N and N is the number of control signals in the plurality of control signals.

17. The method of claim 16 further comprising providing the plurality of clock signals.

18. The method of claim 12 further comprising providing the set-point voltage.

19. The method of claim 18 wherein the step of providing the set-point voltage further comprises providing the set-point voltage to control the supply voltage.

20. The method of claim 12 wherein each of the plurality of currents has essentially the same magnitude.

21. The method of claim 12 wherein the step of generating the plurality of control signals further comprises:
  comparing each of the plurality of current feedback signals to the current loop set-point voltage;
  providing a plurality of current error signals based on the comparison of each of the plurality of current feedback signals and the current loop set-point voltage; and
  generating the plurality of control signals, each of the plurality of control signals generated based on a comparison of one of a plurality of clock signals and one of the plurality of current error signals.

22. The method of claim 21 further comprising providing the plurality of clock signals such that each of the plurality of clock signals is out of phase with a first of the plurality of clock signals by multiples of 360°/N and N is the number of control signals in the plurality of control signals.

23. The method of claim 12 wherein the step of generating the plurality of control signals further comprises:
  comparing each of the plurality of current feedback signals to the current loop set-point voltage;
  providing a plurality of modulated signals, wherein each of the plurality of modulated signals is provided based on the comparison of one of the plurality of current feedback signals and the current loop set-point voltage; and
  generating the plurality of control signals, each of the plurality of control signals generated based on one of the plurality of modulated signals and one of a plurality of clock signals.

24. The method of claim 23 further comprising providing the plurality of clock signals such that each of the plurality of clock signals is out of phase with a first of the plurality of clock signals by multiples of 360°/N and N is the number of control signals in the plurality of control signals.

25. The method of claim 12 wherein the step of generating the plurality of control signals is further based on a plurality of clock signals.

26. The method of claim 25 further comprising providing the plurality of clock signals such that each of the plurality of clock signals is out of phase with a first of the plurality of clock signals by multiples of 360°/N and N is the number of control signals in the plurality of control signals.

* * * * *